(12) United States Patent
Takahashi

(10) Patent No.: US 12,500,140 B2
(45) Date of Patent: Dec. 16, 2025

(54) SEMICONDUCTOR DEVICE AND METHOD FOR MANUFACTURING SAME

(71) Applicant: FUJI ELECTRIC CO., LTD., Kawasaki (JP)

(72) Inventor: Hideaki Takahashi, Omachi (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 524 days.

(21) Appl. No.: 17/976,069

(22) Filed: Oct. 28, 2022

(65) Prior Publication Data

US 2023/0207427 A1 Jun. 29, 2023

(30) Foreign Application Priority Data

Dec. 23, 2021 (JP) ................. 2021-209663

(51) Int. Cl.
*H01L 23/48* (2006.01)
*H01L 23/053* (2006.01)
*H01L 23/08* (2006.01)
*H01L 25/075* (2006.01)
*H01R 4/30* (2006.01)
*H01R 43/18* (2006.01)
*H01R 43/24* (2006.01)

(52) U.S. Cl.
CPC ............ *H01L 23/48* (2013.01); *H01L 23/08* (2013.01); *H01R 4/305* (2013.01); *H01R 43/18* (2013.01); *H01R 43/24* (2013.01)

(58) Field of Classification Search
CPC . H01L 21/4803; H01L 21/4871; H01L 23/48; H01L 23/08; H01L 23/04; H01L 23/053; H01L 23/49811; H01L 23/492; H01L 23/10; H01L 25/072; H01R 4/305; H01R 4/18; H01R 4/24; H01R 43/18; H01R 43/24
See application file for complete search history.

(56) References Cited

U.S. PATENT DOCUMENTS

| | | | | |
|---|---|---|---|---|
| 5,825,085 | A | * | 10/1998 | Masumoto ............ H01L 25/072 257/723 |
| 8,622,772 | B2 | | 1/2014 | Akuta |
| 9,881,846 | B2 | | 1/2018 | Yamada |
| 2012/0225593 | A1 | | 9/2012 | Akuta |
| 2017/0117201 | A1 | | 4/2017 | Yamada |
| 2018/0374817 | A1 | * | 12/2018 | Eguchi ................. H01L 25/072 |

(Continued)

FOREIGN PATENT DOCUMENTS

| | | |
|---|---|---|
| JP | 9-69603 A | 3/1997 |
| JP | 2012-185926 A | 9/2012 |

(Continued)

*Primary Examiner* — Omar F Mojaddedi

(57) ABSTRACT

A semiconductor device includes: a plate-shaped terminal including one main surface and another main surface and having one end electrically connected to a semiconductor chip; a nut arranged on the one main surface side at another end of the terminal; a nut cover provided on the one main surface side at the other end of the terminal and configured to cover the nut; and a case configured to surround the semiconductor chip and integrate the terminal and the nut cover, wherein the nut cover includes a protruding portion protruding from a lower portion of the nut cover to the one end side of the terminal.

11 Claims, 6 Drawing Sheets

(56) References Cited

U.S. PATENT DOCUMENTS

| | | | | |
|---|---|---|---|---|
| 2020/0266117 A1* | 8/2020 | Nakata | .................. | H01L 25/072 |
| 2021/0407887 A1* | 12/2021 | Yu | ....................... | H01L 23/3157 |
| 2022/0181226 A1* | 6/2022 | Yamanaka | ........ | H01L 23/49524 |

FOREIGN PATENT DOCUMENTS

| JP | 2017-84881 A | 5/2017 |
|---|---|---|
| JP | 2019-54296 A | 4/2019 |
| JP | 2019-192709 A | 10/2019 |

\* cited by examiner

SEMICONDUCTOR DEVICE AND METHOD FOR MANUFACTURING SAME

CROSS-REFERENCE TO RELATED APPLICATION

This application claims benefit of priority under 35 USC 119 based on Japanese Patent Application No. 2021-209663 filed on Dec. 23, 2021, the entire contents of which are incorporated by reference herein.

BACKGROUND OF THE INVENTION

1. Field of the Invention

The present invention relates to semiconductor devices (semiconductor modules) and methods for manufacturing the same.

2. Description of the Related Art

Semiconductor modules used to drive inverters of electric and hybrid vehicle motors are known. In such semiconductor modules, a resin case is provided to surround semiconductor chips mounted on insulated circuit substrates. External terminals are electrically connected to the semiconductor chips. The external terminals are insert-molded integrally with the case when molding the case. Nuts for bolting conductors such as bus bars extending from an electronic device such as an inverter are bonded to the external terminals.

Covering the nuts when molding the case to insulate between the nuts to be each contacted with the plurality of external terminals may cause a void in a portion between the nuts and thereby reduce insulation between them. Therefore, in manufacturing a semiconductor module, resinous nut covers (nut gloves) for covering nuts are molded by primary molding, and a resinous case is molded to cover the nut covers by secondary molding.

JP 2012-185926 A discloses a terminal block that fastens conductors by stacking them and tightening bolts. The terminal block includes a plurality of nuts on which the conductors are mounted and partition walls separating adjacent nuts. Each partition wall includes an insulating wall made of a primary molded resin that extends in a direction intersecting a nut alignment direction and that is located in a range of at least from a lower surface of each nut to an upper surface of a bolt fastened to the nut to insulate between the adjacent nuts and a secondary molded portion made of a secondary molded resin that fills a gap between the insulating wall and the nut and that covers side surfaces of the insulating wall over an entire periphery thereof. An upper surface of the secondary molded portion is provided with an exposed portion that exposes a part of a protruding portion provided to protrude upward from an upper end of the insulating wall.

JP H9-69603 A discloses a method for molding an outer case of a power semiconductor device. In this method, a terminal nut cover, which is provided with a first recessed portion that covers and can support a terminal nut so that the terminal nut does not rotate during tightening of a bolt and a second recessed portion that allows a tip of a threaded part of the bolt to protrude, is molded in advance. Next, an electrode plate with a terminal portion bent into a predetermined shape in advance by a press machine or the like and the terminal nut cover including the terminal nut inserted and supported in the first recessed portion are installed in an outer case mold, and then, these are insert-molded integrally with the outer case.

JP 2019-192709 A discloses a bus bar module that includes a pair of bus bars and a resin sealing body for sealing the pair of bus bars. The pair of bus bars are adjacent to each other at a predetermined distance in a thickness direction of the bus bars. The resin sealing body includes a first resin portion and a second resin portion in contact with each other.

JP 2019-054296 A discloses a power semiconductor module that includes a module main body portion including a base substrate mounted with power semiconductor elements and a primary molded body being a resin molded body with a plurality of terminals and a secondary molded body that includes the module main body portion thereinside and that is resin-molded with parts of a plurality of terminals exposed. The primary molded body includes three or more leg portions protruding onto a mounting surface side of the base substrate.

JP 2017-084881 A discloses a semiconductor device that includes a case and a laminated substrate stored in each of storing portions of the case. A positive electrode and a negative electrode are connected to P terminals and N terminals, respectively. A control signal is applied to each of control terminals, and an output corresponding to the control signal is obtained from a U terminal, a V terminal, and a W terminal.

SUMMARY OF THE INVENTION

However, the method of molding a resinous nut cover by primary molding and molding a resinous case by secondary molding, as described in JP 2012-185926 A, is likely to cause a hollow (void) to occur in the case molded by the secondary molding.

In view of the above problem, it is an object of the present invention to provide a semiconductor device that, when molding a resinous nut cover by primary molding and molding a resinous case by secondary molding, can suppress voids from occurring in the case, and a method for manufacturing the semiconductor device.

An aspect of the present invention inheres in a semiconductor device including: a plate-shaped terminal including one main surface and another main surface and having one end electrically connected to a semiconductor chip and another end provided with a bolt insertion hole; a nut arranged on the one main surface side at the other end of the terminal; a nut cover provided on the one main surface side at the other end of the terminal and configured to cover the nut; and a case configured to surround the semiconductor chip and integrate the terminal and the nut cover, wherein the nut cover includes a protruding portion protruding to the one end side of the terminal.

Another aspect of the present invention inheres in a method for a semiconductor device including: molding a nut cover including a covering portion formed with a hole for fitting a nut and a protruding portion protruding from the covering portion; fitting the nut in the covering portion; installing, in a mold, a plate-shaped terminal including one main surface and another main surface and having one end electrically connected to a semiconductor chip and another end provided with a bolt insertion hole; arranging the nut cover in which the nut is fitted on the one main surface side at the other end of the terminal so that the protruding portion protrudes to the one end side of the terminal; and molding a case configured to integrate the terminal and the nut cover.

DETAILED DESCRIPTION

Figure 1:
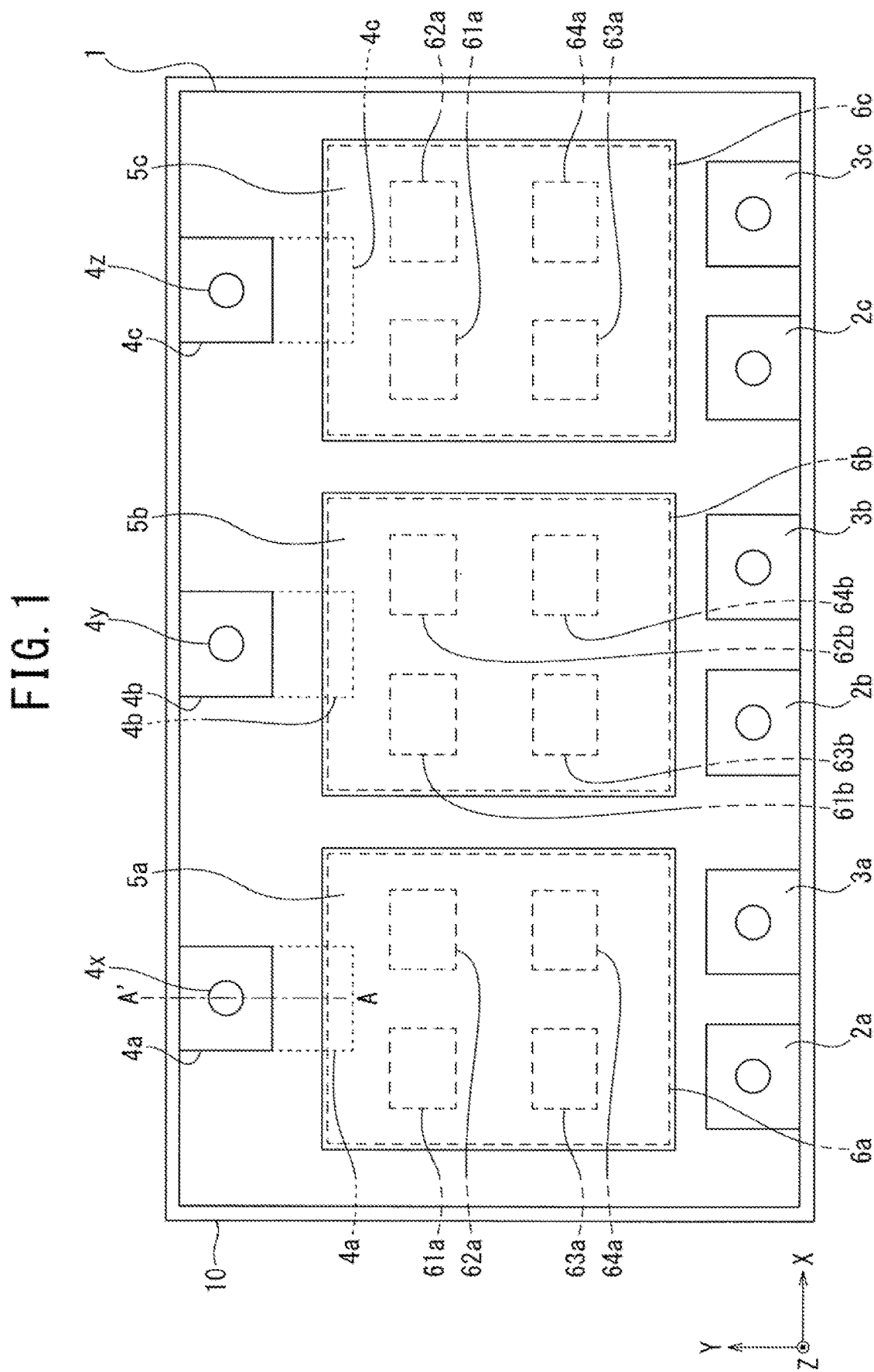
FIG. 1 is a schematic plan view of a semiconductor device according to an embodiment as seen from an upper surface side thereof.

With reference to the Drawings, an embodiment of the present invention will be described below.

In the Drawings, the same or similar elements are indicated by the same or similar reference numerals. The Drawings are schematic, and it should be noted that the relationship between thickness and planer dimensions, the thickness proportion of each layer, and the like are different from real ones. Accordingly, specific thicknesses or dimensions should be determined with reference to the following description. Moreover, in some drawings, portions are illustrated with different dimensional relationships and proportions.

The embodiment described below merely illustrate schematically devices and methods for specifying and giving shapes to the technical idea of the present invention, and the span of the technical idea is not limited to materials, shapes, structures, and relative positions of elements described herein.

In the Specification, definitions of directions such as an up-and-down direction in the following description are merely definitions for convenience of understanding, and are not intended to limit the technical ideas of the present invention. For example, as a matter of course, when the subject is observed while being rotated by 90°, the subject is understood by converting the up-and-down direction into the right-and-left direction. When the subject is observed while being rotated by 180°, the subject is understood by inverting the up-and-down direction.

EMBODIMENT

<Structure of Semiconductor Device>

As illustrated in FIG. 1, a semiconductor device (semiconductor module) according to an embodiment includes insulated circuit substrates 6a to 6c, power semiconductor elements (semiconductor chips) 61a to 64a, 61b to 64b, and 61c to 64c mounted on a main surface (upper surface) of the insulated circuit substrates 6a to 6c via solder, sintered material, or other bonding material, and a case 1 arranged so as to surround the insulated circuit substrates 6a to 6c and the semiconductor chips 61a to 64a, 61b to 64b, and 61c to 64c.

As illustrated in FIG. 1, in plan view of the semiconductor device according to the embodiment, a longitudinal direction of the semiconductor device according to the embodiment is defined as X axis, and a right direction of FIG. 1 is defined as a positive direction of the X axis. Additionally, a transverse direction of the semiconductor device according to the embodiment orthogonal to the X axis is defined as Y axis, and an upper direction of FIG. 1 is defined as a positive direction of the Y axis. In addition, a direction orthogonal to the X and Y axes is defined as Z axis, and a front side of FIG. 1 is defined as a positive direction of the Z axis. The same applies even to FIG. 3 and thereafter.

The material of the case 1 that can be used is a resin material such as polyphenylene sulfide (PPS), polybutylene terephthalate (PBT), polybutylene succinate (PBS), epoxy, or phenol. The case 1 partitions a region arranged with the insulated circuit substrate 6a and the semiconductor chips 61a to 64a, a region arranged with the insulated circuit substrate 6b and the semiconductor chips 61b to 64b, and a region arranged with the insulated circuit substrate 6c and the semiconductor chips 61c to 64c, respectively.

The region arranged with the insulated circuit substrate 6a and the semiconductor chips 61a to 64a partitioned by the case 1 is filled with a sealing member 5a that seals the insulated circuit substrate 6a and the semiconductor chips 61a to 64a. The region arranged with the insulated circuit substrate 6b and the semiconductor chips 61b to 64b partitioned by the case 1 is filled with a sealing member 5b that seals the insulated circuit substrate 6b and the semiconductor chips 61b to 64b. The region arranged with the insulated circuit substrate 6c and the semiconductor chips 61c to 64c partitioned by the case 1 is filled with a sealing member 5c that seals the insulated circuit substrate 6c and the semiconductor chips 61c to 64c. For example, an insulating material such as silicone gel, epoxy-based resin, or other thermosetting resin can be used as the sealing members 5a to 5c. Dashed lines in FIG. 1 schematically illustrate the insulated circuit substrates 6a to 6c and the semiconductor chips 61a to 64a, 61b to 64b, and 61c to 64c sealed by the sealing members 5a to 5c.

The insulated circuit substrates 6a to 6c may be, for example, direct copper bonded (DCB) substrates, active metal brazed (AMB) substrates, or the like. The insulated circuit substrates 6a to 6c include an insulating plate, a conductive plate (circuit board) arranged on an upper surface of the insulating plate, and a conductive plate (heat sink) arranged on a lower surface of the insulating plate. The insulating plate is composed of, for example, a ceramic substrate made of aluminum oxide ($Al_2O_3$), aluminum nitride (AlN), silicon nitride ($Si_3N_4$), or the like, or a resin insulating substrate made of a polymer material or the like. The conductive plate is composed of, for example, a conductive foil such as a copper (Cu) foil, an aluminum (Al) foil, or the like.

The semiconductor chips 61a to 64a, 61b to 64b, and 61c to 64c can be composed of, field effect transistors (FET) such as MOSFETs, insulated gate bipolar transistors (IGBTs), static induction (SI) thyristors, gate turn-off (GTO) thyristors, or the like. Here is a description of the semiconductor chips 61a to 64a, 61b to 64b, and 61c to 64c that incorporate MOSFETs.

The semiconductor chips 61a to 64a, 61b to 64b, and 61c to 64c include a semiconductor substrate, a first main electrode (drain electrode) provided on a lower surface side of the semiconductor substrate, and a second main electrode (source electrode) and a control electrode (gate electrode) provided on an upper surface side of the semiconductor substrate. The semiconductor substrate is made of, for example, silicon (Si), silicon carbide (SiC), gallium nitride (GaN), gallium oxide ($Ga_2O_3$), or the like. The arrangement positions and number of the semiconductor chips 61a to 64a, 61b to 64b, and 61c to 64c are not particularly limited.

FIG. 1 exemplifies a 6-in-1 type power semiconductor module. For example, the semiconductor chips 61a and 62a constitute lower arms of phase U of a three-phase inverter circuit, and the semiconductor chips 63a and 64a constitute upper arms of phase U thereof. The semiconductor chips 61b and 62b constitute lower arms of phase V thereof, and the semiconductor chips 63b and 64b constitute upper arms of phase V thereof. The semiconductor chips 61c and 62c constitute lower arms of phase W thereof, and the semiconductor chips 63c and 64c constitute upper arms of phase W thereof.

The case 1 is insert-molded so as to integrate plate-shaped output terminals 4a to 4c, plate-shaped positive electrode terminals 2a to 2c, plate-shaped negative electrode terminals 3a to 3c, and the like. The output terminals 4a to 4c are provided on one side of each of the insulated circuit substrates 6a to 6c of the case 1. In FIG. 1, portions of the output terminals 4a to 4c embedded in the case 1 and extending to the insulated circuit substrates 6a to 6c side and portions thereof sealed by the sealing members 5a to 5c are schematically illustrated by dashed lines.

The output terminals 4a to 4c are provided with bolt insertion holes 4x to 4z, respectively. A positive electrode terminal 2a and a negative electrode terminal 3a are provided on a side of the case 1 opposite to the one side of the insulated circuit substrate 6a where the output terminal 4a is provided. A positive electrode terminal 2b and a negative electrode terminal 3b are provided on a side of the case 1 opposite to the one side of the insulated circuit substrate 6b where the output terminal 4b is provided. A positive electrode terminal 2c and a negative electrode terminal 3c are provided on a side of the case 1 opposite to the one side of the insulated circuit substrate 6c where the output terminal 4c is provided. Copper (Cu), Cu alloy, aluminum (Al), Al alloy, or the like can be used as the material of the positive electrode terminals 2a to 2c, the negative electrode terminals 3a to 3c, and the output terminals 4a to 4c.

The positive electrode terminal 2a is electrically connected to the drain electrodes of the semiconductor chips 63a and 64a via the insulated circuit substrate 6a. The negative electrode terminal 3a is electrically connected to the source electrodes of the semiconductor chips 61a and 62a via the insulated circuit substrate 6a. The output terminal 4a is electrically connected to the drain electrodes of the semiconductor chips 61a and 62a and the source electrodes of the semiconductor chips 63a and 64a via the insulated circuit substrate 6a.

The positive electrode terminal 2b is electrically connected to the drain electrodes of the semiconductor chips 63b and 64b via the insulated circuit substrate 6b. The negative electrode terminal 3b is electrically connected to the source electrodes of the semiconductor chips 61b and 62b via the insulated circuit substrate 6b. The output terminal 4b is electrically connected to the drain electrodes of the semiconductor chips 61b and 62b and the source electrodes of the semiconductor chips 63b and 64b via the insulated circuit substrate 6b.

The positive electrode terminal 2c is electrically connected to the drain electrodes of the semiconductor chips 63c and 64c via the insulated circuit substrate 6c. The negative electrode terminal 3c is electrically connected to the source electrodes of the semiconductor chips 61c and 62c via the insulated circuit substrate 6c. The output terminal 4c is electrically connected to the drain electrodes of the semiconductor chips 61c and 62c and the source electrodes of the semiconductor chips 63c and 64c via the insulated circuit substrate 6c.

Although not illustrated in FIG. 1, the semiconductor device according to the embodiment further includes control terminals for applying a control signal to the gate electrodes of the semiconductor chips 61a to 64a, 61b to 64b, and 61c to 64c on peripheral portions of the insulated circuit substrates 6a to 6c. Additionally, the semiconductor device according to the embodiment may further include current detection terminals for detecting current flowing through the source electrodes of the semiconductor chips 61a to 64a, 61b to 64b, and 61c to 64c on the peripheral portions of the insulated circuit substrates 6a to 6c.

Lower surfaces of the case 1 and the insulated circuit substrates 6a to 6c are bonded to a heat dissipating base 10 as a cooling body made of a metal such as copper (Cu) via a bonding layer of solder or the like. As the material of the heat dissipating base 10, a material having high thermal conductivity can be used, such as copper (Cu), aluminum (Al), a composite material (AlSiC) consisting of aluminum (Al) and silicon carbide (SiC), or a composite material (MgSiC) consisting of magnesium (Mg) and silicon carbide (SiC). A lower surface of the heat dissipating base 10 is bonded to heat dissipating fins (not illustrated) made of a metal such as copper (CU) via a thermal compound. Alternatively, the heat dissipating fins may be integrally formed with the lower surface of the heat dissipating base 10.

Figure 2:
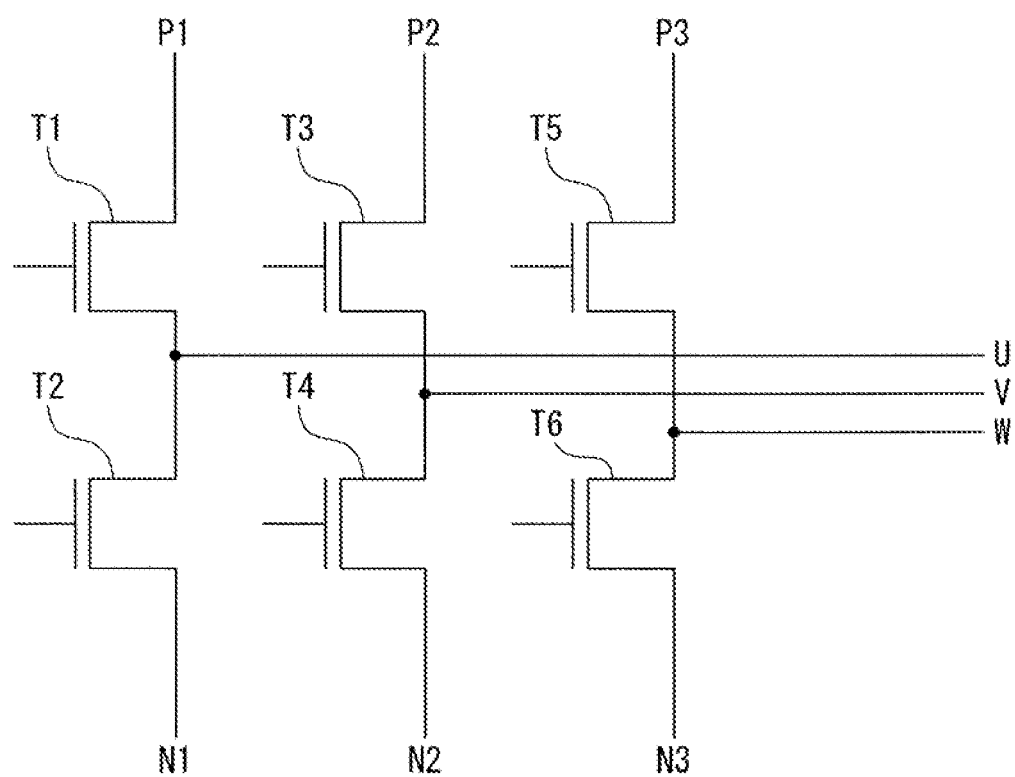
FIG. 2 is an equivalent circuit diagram of the semiconductor device according to the embodiment.

FIG. 2 illustrates an equivalent circuit of the semiconductor device according to the embodiment illustrated in FIG. 1. As illustrated in FIG. 2, the semiconductor device according to the embodiment constitutes a three-phase bridge circuit. A drain electrode of a transistor T1 on an upper arm side is connected to a positive electrode terminal P1, and a source electrode of a transistor T2 on a lower arm side is connected to a negative electrode terminal N1. A source electrode of the transistor T1 and a drain electrode of the transistor T2 are connected to an output terminal U. A drain electrode of a transistor T3 on the upper arm side is connected to a positive electrode terminal P2, and a source electrode of a transistor T4 on the lower arm side is connected to a negative electrode terminal N2. A source electrode of the transistor T3 and a drain electrode of the transistor T4 are connected to an output terminal V. A drain electrode of a transistor T5 on the upper arm side is connected to a positive electrode terminal P3, and a source electrode of a transistor T6 on the lower arm side is connected to a negative electrode terminal N3. A source electrode of the transistor T5 and a drain electrode of the transistor T6 are connected to an output terminal W.

The output terminals U, V, and W illustrated in FIG. 2 correspond to the output terminals 4a to 4c illustrated in FIG. 1. The positive electrode terminals P1 to P3 illustrated in FIG. 2 correspond to the positive electrode terminals 2a to 2c illustrated in FIG. 1. The negative electrode terminals N1 to N3 illustrated in FIG. 2 correspond to the negative electrode terminals 3a to 3c illustrated in FIG. 1. The transistor T1 and the transistor T2 illustrated in FIG. 2 correspond to the semiconductor chips 63a and 64a and the semiconductor chips 61a and 62a illustrated in FIG. 1. The transistor T3 and the transistor T4 illustrated in FIG. 2 correspond to the semiconductor chips 63b and 64b and the semiconductor chips 61b and 62b illustrated in FIG. 1. The transistor T5 and the transistor T6 illustrated in FIG. 2 correspond to the semiconductor chips 63c and 64c and the semiconductor chips 61c and 62c illustrated in FIG. 1.

Figure 3:
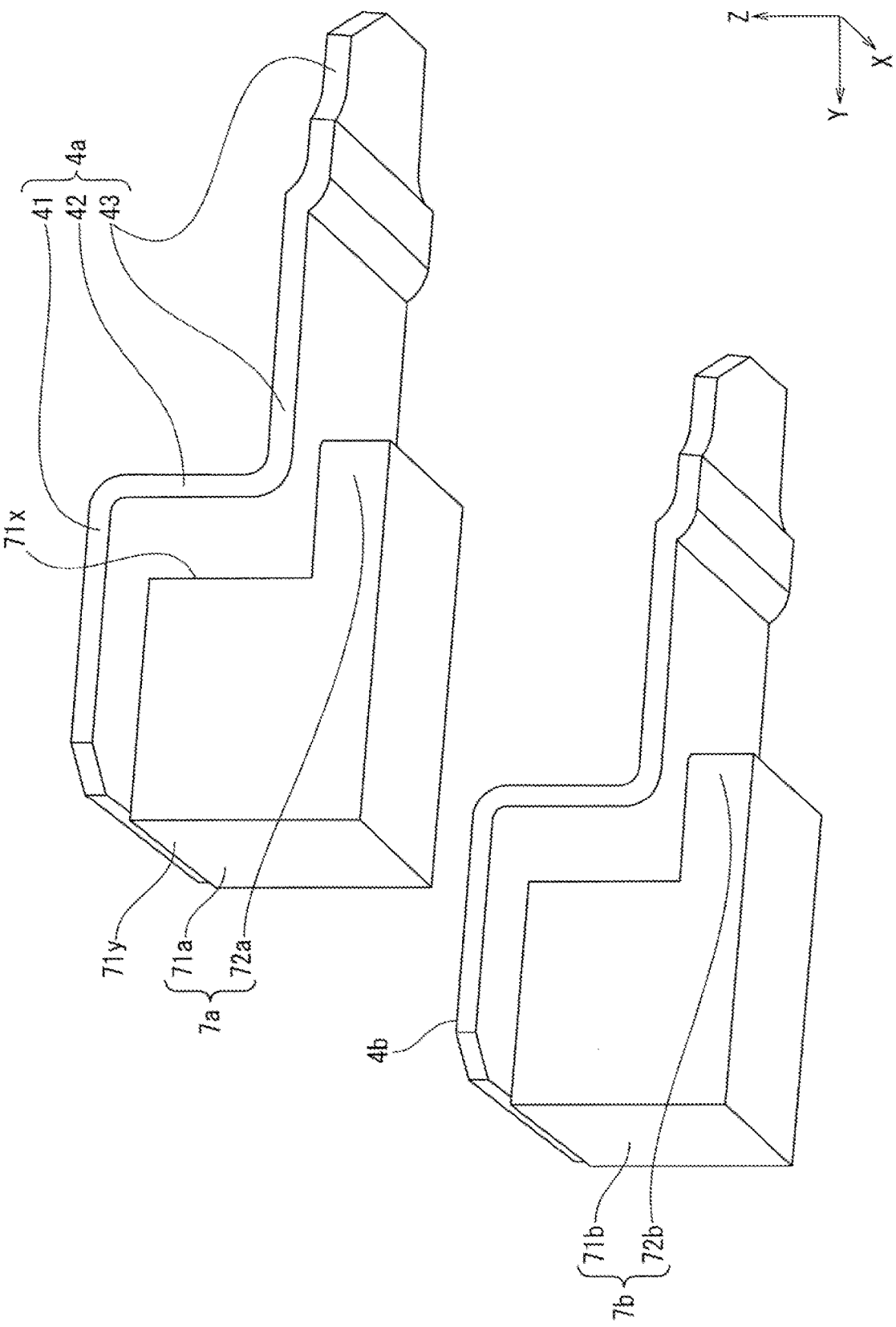
FIG. 3 is a perspective view of a part of the semiconductor device according to the embodiment.
Figure 4:
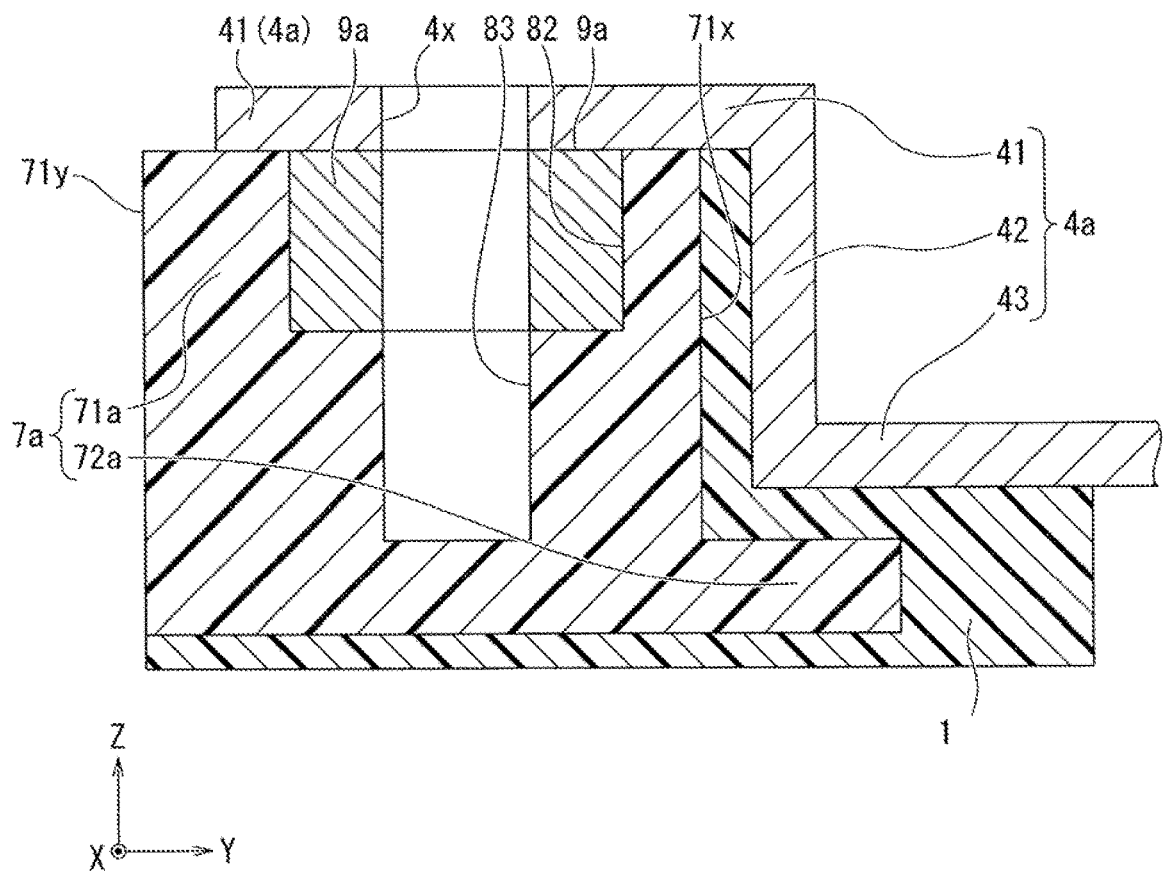
FIG. 4 is a sectional view taken along line A-A' of FIG. 1.
Figure 5:
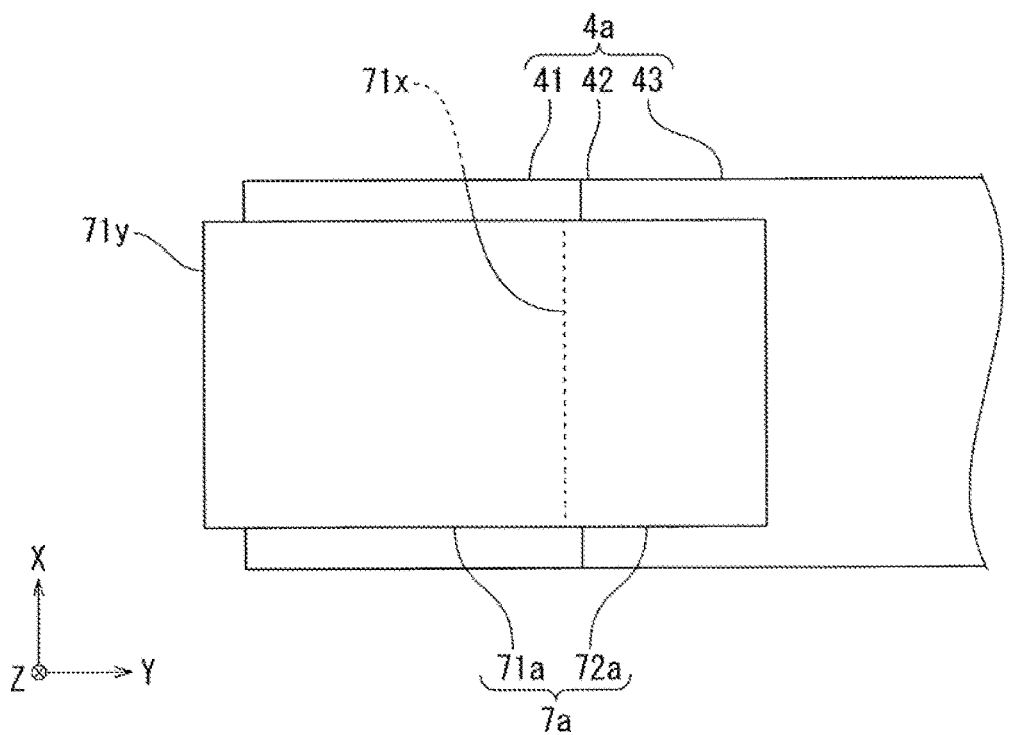
FIG. 5 is a schematic plan view of a part of the semiconductor device according to the embodiment as seen from a lower surface side thereof.

On lower surfaces of positions where the bolt insertion holes 4x and 4y of the output terminals 4a and 4b illustrated in FIG. 1 are provided, resinous nut covers (nut gloves) 7a and 7b are provided, as illustrated in FIG. 3. FIG. 3 is a perspective view illustrating the nut covers 7a and 7b and the output terminals 4a and 4b without illustration of the case 1. FIG. 4 is a sectional view taken along line A-A' passing through a position of the bolt insertion hole 4x of the output terminal 4a in FIG. 1. FIG. 5 is a plan view as seen from lower surface sides of the nut cover 7a and the output terminal 4a without illustration of the case 1.

As illustrated in FIG. 1, FIG. 3, and FIG. 4, the output terminal 4a has a shape bent into a Z shape as seen from a lateral side. The output terminal 4a includes one main surface (upper surface) and another main surface (lower surface), and has one end electrically connected to the drain electrodes of the semiconductor chips 61a and 62a and the source electrodes of the semiconductor chips 63a and 64a and another end provided with the bolt insertion hole 4x. The output terminal 4a includes an external connection portion 41 extending in a substantially horizontal direction, a vertical portion 42 connected to the external connection portion 41 via a bent portion and extending in a direction (substantially vertical direction) orthogonal to the extending direction of the external connection portion 41, and an internal connection portion 43 connected to the vertical portion 42 via a bent portion and extending in a substantially horizontal direction.

The external connection portion 41 corresponds to the other end provided with the bolt insertion hole 4x. As illustrated in FIG. 4, the external connection portion 41 is provided with the bolt insertion hole 4x in which a bolt is to be inserted. The internal connection portion 43 corresponds to the one end electrically connected to the drain electrodes of the semiconductor chips 61a and 62a and the source electrodes of the semiconductor chips 63a and 64a. The internal connection portion 43 extends inward of the case 1 and is bonded to the insulated circuit substrate 6a via a bonding layer of solder or the like.

As illustrated in FIG. 4, a nut 9a is arranged on a lower surface of the external connection portion 41 of the output terminal 4a. The nut 9a includes a threaded hole communicating with the bolt insertion hole 4x of the external connection portion 41. A bolt is tightened into the threaded hole of the nut 9a across a conductor such as a bus bar extending from an electronic device such as an inverter.

As illustrated in FIG. 3 to FIG. 5, a nut cover 7a in which the nut 9a is fitted is arranged on the lower surface of the external connection portion 41 of the output terminal 4a. As the material of the nut cover 7a, a resin material can be used, such as polyphenylene sulfide (PPS), polybutylene terephthalate (PBT), polybutylene succinate (PBS), epoxy, or phenol. The nut cover 7a may be made of the same material as or a different material from that of the case 1. The nut cover 7a includes a covering portion 71a in which a hole (recessed portion) 82 for fitting the nut 9a and a hole (recessed portion) 83 for fitting a bolt are formed and which covers the nut 9a fitted into the hole 82 and a protruding portion (lateral protruding portion) 72a provided so as to protrude laterally from a lower part of the covering portion 71a.

As illustrated in FIG. 3 to FIG. 5, the covering portion 71a has a substantially rectangular parallelepiped shape. A side surface 71x of the covering portion 71a faces the vertical portion 42 of the output terminal 4a. FIG. 3 to FIG. 5 exemplify a case where the side surface 71x of the covering portion 71a is away from the vertical portion 42 of the output terminal 4a. However, the side surface 71x of the covering portion 71a may be in contact with the vertical portion 42 of the output terminal 4a.

As illustrated in FIG. 3 to FIG. 5, the lateral protruding portion 72a is provided so as to extend inward of the case 1, i.e., to the internal connection portion 43 side of the output terminal 4a. The lateral protruding portion 72a includes a portion that extends to a position below the internal connection portion 43 of the output terminal 4a and facing the internal connection portion 43 and that overlaps the internal connection portion 43 in a vertical direction.

As illustrated in FIG. 4, the nut cover 7a is covered by the case 1. The case 1 is provided so as to cover a lower surface of the covering portion 71a, a lower surface of the lateral protruding portion 72a, a side surface of a leading end portion of the lateral protruding portion 72a, and a part of a lower surface of the internal connection portion 43. The resin of the case 1 also enters between an upper surface of the lateral protruding portion 72a and the internal connection portion 43 and between the side surface 71x of the covering portion 71a and the vertical portion 42. A side surface 71y on an opposite side of the side surface 71x of the covering portion 71a is exposed from a side surface of the case 1. The portions of the nut cover 7a in contact with the case 1 may be crinkle-textured. Crinkle-texturing the nut cover 7a can increase bonding strength between the resin of the nut cover 7a and the resin of the case 1.

The nut cover 7b illustrated in FIG. 3 also has the same structure as that of the nut cover 7a. As illustrated in FIG. 3, the nut cover 7b is provided on a lower surface of the output terminal 4b at a position of the bolt insertion hole 4y (see FIG. 1). The nut covers 7a and 7b are spaced apart from each other along a direction in which the output terminals 4a and 4b are aligned. The nut cover 7b includes a covering portion 71b that covers a nut (not illustrated) and a lateral protruding portion 72b provided so as to protrude laterally from a lower part of the covering portion 71b. The lateral protruding portion 72b of the nut cover 7b extends in parallel with the lateral protruding portion 72a of the nut cover 7a.

Although not illustrated in the drawing, the same nut cover as the nut covers 7a and 7b is provided on a lower surface of the output terminal 4c at a position of the bolt insertion hole 4z illustrated in FIG. 1.

Figure 6:
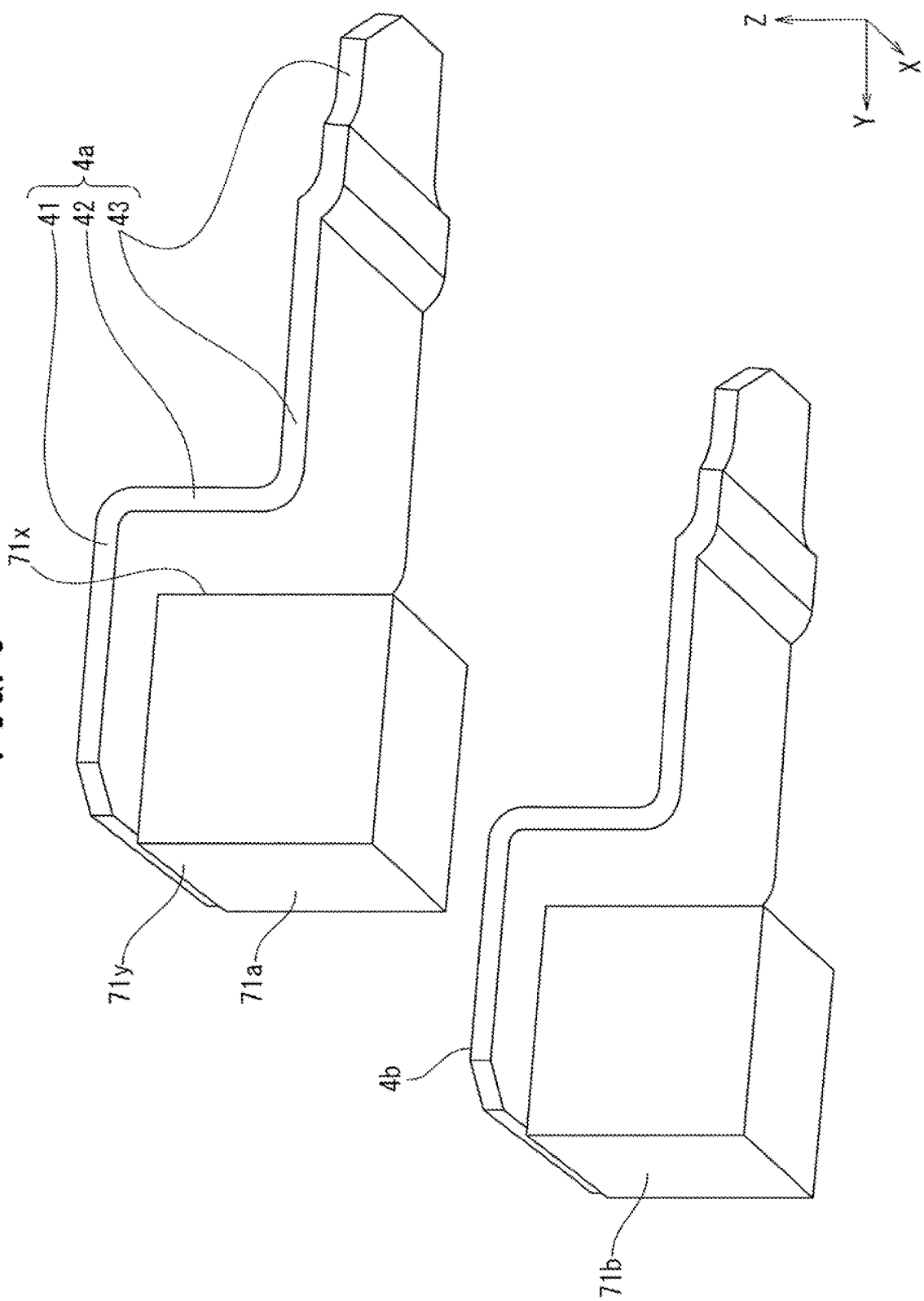
FIG. 6 is a perspective view of a semiconductor device according to a comparative example corresponding to FIG. 3.
Figure 7:
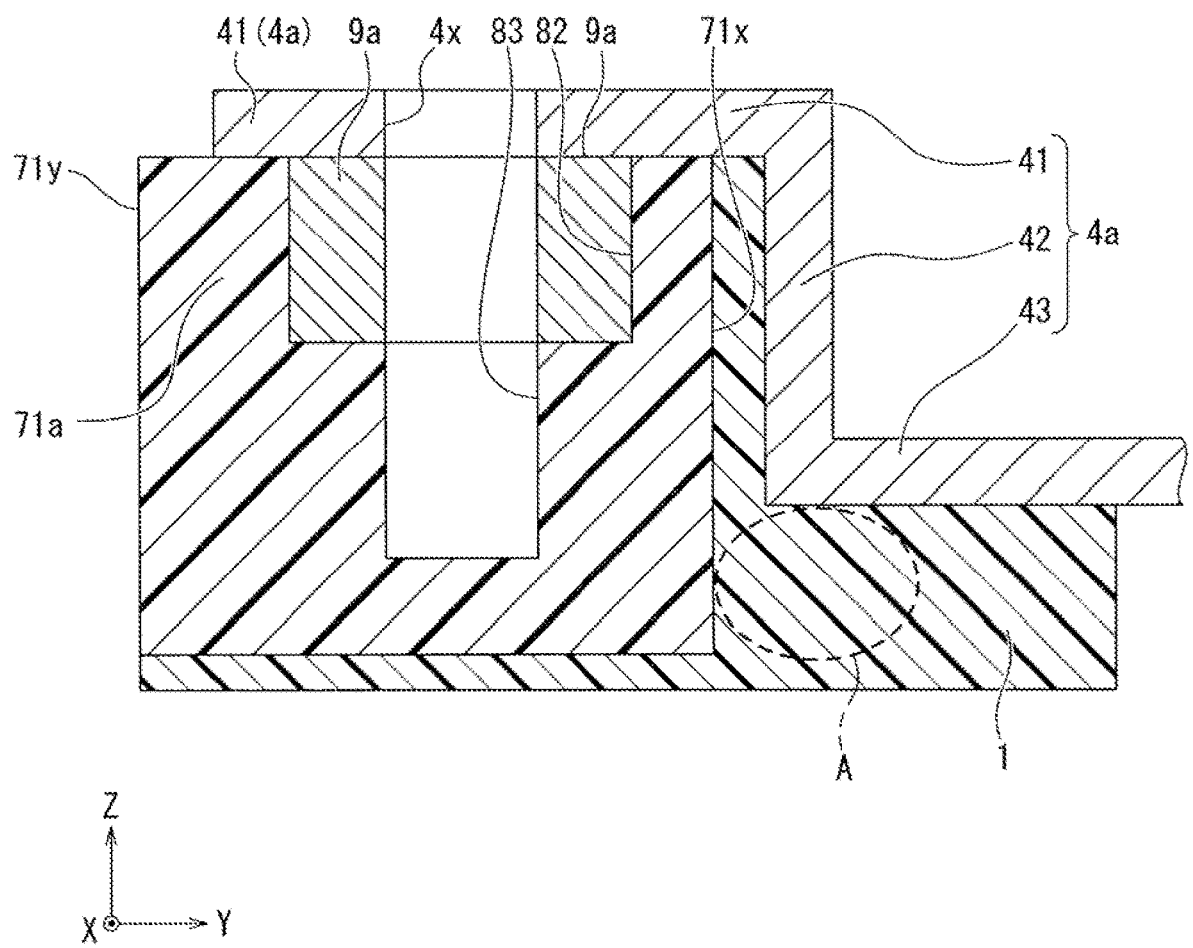
FIG. 7 is a sectional view of the semiconductor device according to the comparative example corresponding to FIG. 4.

Here is a description of a semiconductor device according to a comparative example. FIG. 6 is a perspective view of the semiconductor device according to the comparative example corresponding to FIG. 3, and FIG. 7 is a sectional view of the semiconductor device according to the comparative example corresponding to FIG. 4. As illustrated in FIG. 6 and FIG. 7, the semiconductor device according to the comparative example is different from the semiconductor device according to the embodiment illustrated in FIG. 3 to FIG. 5 in that no lateral protruding portion is provided at lower parts of the nut covers 7a and 7b.

As illustrated in FIG. 7, in the semiconductor device according to the comparative example, there is no lateral protruding portion on a side surface of the covering portion 71a of the nut cover 7a. Therefore, in a region A below the internal connection portion 43 of the output terminal 4a, a part of the case 1 is molded at secondary molding. However, when there is a thick portion like the region A in the case 1 to be subjected to secondary molding, the thick portion has much resin shrinkage when temperature goes from high to low and resin shrinks after pouring resin in the mold, so that voids are likely to be formed in the thick portion. Additionally, when pouring the resin in the mold, air bubbles tend to remain due to poor resin flowability.

On the other hand, in the semiconductor device according to the embodiment, providing the lateral protruding portion 72a at the lower part of the covering portion 71a of the nut cover 7a can increase volume of resin when molding the nut cover 7a by primary molding, as illustrated in FIG. 3 to FIG. 5. As a result, since the secondary casting mold has the lateral protruding portion 72a that is a solid, the thick portion below the internal connection portion 43 of the output terminal 4a can be reduced, allowing for reduced resin shrinkage. This can suppress voids from occurring in the region below the internal connection portion 43.

Furthermore, providing the lateral protruding portion 72a in the nut cover 7a can improve strength against stress in a rotational direction that occurs when tightening the nut 9a with a bolt, which can suppress rotation of the nut cover 7a.

<Method for Manufacturing Semiconductor Device>

Next, an example of a method for manufacturing the semiconductor device according to the embodiment is described with reference to FIG. 1 and FIG. 3 to FIG. 5. First, in primary molding, a resin material is filled in a mold to mold the primary molded body (nut cover) 7a made of resin illustrated in FIG. 3 to FIG. 5. The nut cover 7a includes the covering portion 71a formed with the hole (recessed portion) 82 for fitting the nut 9a and the hole (recessed portion) 83 for fitting a bolt, and the lateral protruding portion 72a protruding laterally from the lower part of the covering portion 71a. Then, the nut 9a is fitted into the hole 82 formed in the molded nut cover 7a. Although not illustrated in the drawing, the nut cover 7b bonded to the output terminal 4b and the nut cover bonded to the output terminal 4c illustrated in FIG. 1 are also molded as with the nut cover 7a, and nuts are fitted thereinto.

Next, the plate-shaped output terminals 4a to 4c, positive electrode terminals 2a to 2c, and negative electrode terminals 3a to 3c bent into a predetermined shape by a press machine or the like as illustrated in FIG. 1 are installed in a mold. Additionally, the nut cover 7a in which the nut 9a is fitted is installed in the mold. At this time, the nut cover 7a with the nut 9a fitted therein is arranged so that the covering portion 71a contacts an outer surface of the external connection portion 41 of the output terminal 4a and the lateral protruding portion 72a protrudes to the internal connection portion 43 side of the output terminal 4a. Under the output terminal 4b illustrated in FIG. 1 is positioned the nut cover 7b with the nut fitted therein. Under the output terminal 4c is positioned the nut cover with the same nut as that of the nut covers 7a and 7b fitted therein.

Then, in secondary molding, a resin material is filled in the mold, and as illustrated in FIG. 1, the case 1 (secondary molded body) is insert-molded so as to integrate the nut covers 7a, 7b, and the like, the positive electrode terminals 2a to 2c, the negative electrode terminals 3a to 3c, and the output terminals 4a to 4c.

Next, as illustrated in FIG. 1, the semiconductor chips 61a to 64a, 61b to 64b, and 61c to 64c are bonded onto the insulated circuit substrates 6a to 6c via a bonding layer of solder or the like. Then, the insulated circuit substrates 6a to 6c with the semiconductor chips 61a to 64a, 61b to 64b, and 61c to 64c bonded thereonto are bonded onto the heat dissipating base 10 via a bonding layer of solder or the like, and the case 1 is bonded to the heat dissipating base 10 by an adhesive so as to surround the insulated circuit substrates 6a to 6c. At this time, the positive electrode terminals 2a to 2c, the negative electrode terminals 3a to 3c, and the output terminals 4a to 4c integrated with the case 1 are bonded to the insulated circuit substrates 6a to 6c by ultrasonic bonding or the like.

Next, the source electrodes on the upper surface sides of the semiconductor chips 61a to 64a, 61b to 64b, and 61c to 64c are electrically connected to the positive electrode terminals 2a to 2c, the negative electrode terminals 3a to 3c, the output terminals 4a to 4c, and the like via lead frames or the like. Additionally, the gate electrodes on the upper surface sides of the semiconductor chips 61a to 64a, 61b to 64b, and 61c to 64c are electrically connected to the control terminals and the like (not illustrated) via wire bonding of aluminum (Al) wire or the like, or other means.

Then, as illustrated in FIG. 1, the region arranged with the insulated circuit substrate 6a and the semiconductor chips 61a to 64a, the region arranged with the insulated circuit substrate 6b and the semiconductor chips 61b to 64b, and the region arranged with the insulated circuit substrate 6c and the semiconductor chips 61c to 64c partitioned by the case 1 are sealed by the sealing members 5a to 5c, respectively. This results in completion of the semiconductor device according to the embodiment.

In the semiconductor device according to the embodiment, the volume of resin in primary molding can be increased by forming the lateral protruding portions 72a and 72b at the lower parts of the covering portions 71a and 71b of the nut covers 7a and 7b when molding the nut covers 7a and 7b by the primary molding. Therefore, positioning the lateral protruding portions 72a and 72b formed by the primary molding in a thick portion in secondary molding allows for space filling. This can suppress a void from occurring when molding the case 1 and a sink mark from occurring on a surface subjected to secondary molding due to shrinkage of the void.

OTHER EMBODIMENTS

As described above, the invention has been described according to the embodiment, but it should not be understood that the description and drawings implementing a portion of this disclosure limit the invention. Various alternative embodiments of the present invention, examples, and operational techniques will be apparent to those skilled in the art from this disclosure.

For example, although the 6-in-1 type semiconductor module has been exemplified as the semiconductor device according to the embodiment, the present invention is not limited thereto. The present invention may also be applicable to, for example, a 1-in-1 type or 2-in-1 type semiconductor module.

The respective configurations disclosed in the embodiment of the present invention and the respective modified examples can be combined together as necessary within a range without contradicting each other. As described above, the invention includes various embodiments of the present invention and the like not described herein. Therefore, the scope of the present invention is defined only by the technical features specifying the present invention, which are prescribed by claims, the words and terms in the claims shall be reasonably construed from the subject matters recited in the present Specification.

What is claimed is:
1. A semiconductor device comprising:
   a plate-shaped terminal including one main surface and another main surface and having one end electrically connected to a semiconductor chip and another end provided with a bolt insertion hole;
a nut arranged on the one main surface side at the other end of the terminal;
a nut cover provided on the one main surface side at the other end of the terminal and configured to cover the nut; and
a case configured to surround the semiconductor chip and integrate the terminal and the nut cover,
wherein the nut cover includes a covering portion covering the nut and a lateral protruding portion protruding laterally from the covering portion to the one end side of the terminal.

2. The semiconductor device of claim 1, wherein the terminal includes:
an external connection portion corresponding to the other end;
a vertical portion connected to the external connection portion; and
an internal connection portion connected to the vertical portion and corresponding to the one end.

3. The semiconductor device of 2, wherein the protruding portion extends to a position facing the internal connection portion.

4. The semiconductor device of claim 1, wherein the terminal is provided in plurality in parallel, the nut cover being provided on each of the one main surface sides of the plurality of terminals.

5. A method for manufacturing a semiconductor device comprising:
molding a nut cover including a covering portion formed with a hole for fitting a nut and a protruding portion protruding from the covering portion;
fitting the nut in the covering portion;
installing, in a mold, a plate-shaped terminal including one main surface and another main surface and having one end electrically connected to a semiconductor chip and another end provided with a bolt insertion hole;
arranging the nut cover in which the nut is fitted on the one main surface side at the other end of the terminal so that the protruding portion protrudes to the one end side of the terminal; and
molding a case configured to integrate the terminal and the nut cover.

6. The semiconductor device of claim 2, wherein
the covering portion has a first side surface facing the vertical portion, and
the lateral protruding portion protrudes from a lower portion of the first side surface.

7. The semiconductor device of claim 6, wherein
the covering portion has a second side surface on an opposite side of the first side surface, and
the second side surface is exposed from the case.

8. The semiconductor device of claim 2, wherein
the lateral protruding portion extends to a position below the internal connection portion.

9. The semiconductor device of claim 2, wherein
the lateral protruding portion has a portion overlapping the internal connection portion in a vertical direction.

10. The semiconductor device of claim 2, wherein
the case partially enters between an upper surface of the lateral protruding portion and the internal connection portion.

11. The semiconductor device of claim 1, wherein
a lower end of the covering portion is lower than the other end of the terminal.

* * * * *